United States Patent [19]
Uchida

[11] Patent Number: 5,396,481
[45] Date of Patent: Mar. 7, 1995

[54] SEMICONDUCTOR LASER DEVICE WHICH EMITS INCLINED LASER BEAM

[75] Inventor: Satoshi Uchida, Kyoto, Japan

[73] Assignee: Rohm Co., Ltd., Kyoto, Japan

[21] Appl. No.: 161,435

[22] Filed: Dec. 6, 1993

Related U.S. Application Data

[62] Division of Ser. No. 976,503, Nov. 13, 1992, abandoned.

[30] Foreign Application Priority Data

| Nov. 13, 1991 | [JP] | Japan | 3-326439 |
| Feb. 21, 1992 | [JP] | Japan | 4-072277 |
| Feb. 21, 1992 | [JP] | Japan | 4-072278 |

[51] Int. Cl.$^6$ .................. G11B 7/00; H01L 23/00
[52] U.S. Cl. .................. 369/121; 369/107; 369/122; 372/46; 372/45; 372/43
[58] Field of Search .................. 372/43, 44, 45, 46, 372/47, 48, 49, 50, 8, 36; 369/116, 107, 112, 118, 122, 121

[56] References Cited

U.S. PATENT DOCUMENTS

| 4,395,769 | 7/1983 | Damen et al. | 372/43 X |
| 4,432,091 | 2/1984 | Kuroda et al. | 372/45 |
| 4,654,839 | 3/1987 | Endo | 369/116 |
| 4,856,014 | 8/1989 | Figueroa et al. | 372/46 |
| 5,235,609 | 8/1993 | Uchida et al. | 372/46 |
| 5,283,799 | 2/1994 | Jacquet et al. | 372/46 |

FOREIGN PATENT DOCUMENTS 60-79786  5/1985  Japan .................. 372/43 X

*Primary Examiner*—Paul M. Dzierzynski
*Assistant Examiner*—Kim-Kwok Chu
*Attorney, Agent, or Firm*—William H. Eilberg

[57] ABSTRACT

A semiconductor laser chip comprises a substrate and material layers successively formed on the substrate. The laser chip has an output cleavage face and emits an output laser beam which is inclined to the output cleavage face. The laser chip may be incorporated in a laser pickup device for optically reading information from an optical data carrier such as optical disk.

4 Claims, 5 Drawing Sheets

SEMICONDUCTOR LASER DEVICE WHICH EMITS INCLINED LASER BEAM

This application is a division of application Ser. No. 07/976,503, filed Nov. 13, 1992, now abandoned.

BACKGROUND OF THE INVENTION

1. Field of the Invention

This invention relates to a semiconductor laser chip. The present invention also relates to a laser pickup device which incorporates a semiconductor laser chip. The invention further relates to a method of making a semiconductor laser chip.

2. Description of the Prior Art

As is well known, a laser pickup device is used for optically reading information from an optical data carrier such optical audio disk or optical video disk. Compared to conventional analog pickup devices wherein the pickup comes into direct mechanical contact with a data carrier, the laser pickup device provides a longer life and prevents damage of the data carrier disk thanks to the absence of direct mechanical contact.

FIG. 14 of the accompanying drawings shows a typical arrangement of a prior art laser pickup device. As shown, the pickup device comprises a laser device LD and an optical system 11a. The laser device LD includes a semiconductor laser chip SLC1 for laser beam emission.

As shown in FIG. 15, the laser chip SLC1 has a stripe 10a (gain region) which extends perpendicularly to an output cleavage face. Thus, the laser chip emits an output laser beam 12a which is perpendicular to the output cleavage face.

The optical system 11a includes a diffraction grating 15, a beam splitter 16, an object lens 17, a concave lens 18, a cylindrical lens 19 and a photosensor 20. The diffraction grating 15 diffracts the output laser beam from the laser chip SLC1 into a main beam $P_0$ and two auxiliary beams $P_1$, $P_2$. The diffracted beams pass through the beam splitter 16 and the object lens 17 for reflection on an optical data carrier disk D. The reflected beams $P_0'$, $P_1'$, $P_2'$ return along the reverse path through the object lens 17. A major portion of the reflected beams $P_0'$, $P_1'$, $P_2'$ is deflected by the beam splitter 16 and passes through the lenses 18, 19 for optical reading by the photosensor 20.

On the other hand, a minor portion of the reflected beams $P_0'$, $P_1'$, $P_2'$ passes through the beam splitter 16 for returning to the laser chip SLC1. The returning beam portion 13a (FIG. 15) is reflected by the output cleavage face of the laser chip SLC1 for re-entry into the optical system 11a. Such re-entry of the returning beam portion is known to cause noises (called "optical feedback induced noise"), consequently deteriorating the performance of the laser pickup device.

Thus, it has been conventionally proposed to provide a low reflective coating on the output cleavage face of the laser chip or otherwise treat the output cleavage face for reducing the optical feedback induced noise. However, such a solution requires an additional process step, thus resulting in a cost increase. Further, the conventional solution does not necessarily result in complete elimination of the return beam noises.

SUMMARY OF THE INVENTION

It is, therefore, an object of the present invention to provide a semiconductor laser chip which is capable of preventing optical feedback induced noise when incorporated in a laser pickup device for optically reading information from an optical data carrier.

Another object of the present invention is to provide a laser pickup device which incorporates such a semiconductor laser chip.

A further object of the present invention is to provide a preferred method for making such a semiconductor laser chip.

According to one aspect of the present invention, there is provided a semiconductor laser chip comprising a substrate and material layers successively formed on the substrate; wherein the laser chip has an output cleavage face and emits an output laser beam which is inclined to the output cleavage face.

To enable such laser beam emission, the laser chip may have a stripe which is inclined to the output cleavage face. Alternatively, the laser chip may have a stripe groove which is perpendicular to the output cleavage face, the chip having different physical properties within the stripe groove on both sides of a central longitudinal axis of the stripe groove. Further alternatively, the substrate may have a growth surface which is inclined relative to a reference crystal plane in one direction, the laser chip having a stripe extending in the same direction as the growth surface is inclined relative to the reference crystal plane, the output cleavage face being perpendicular to the reference crystal plane but inclined relative to the growth surface of the substrate.

According to another aspect of the present invention, there is provided a laser pickup device for optically reading information from an optical data carrier, the pickup device including a semiconductor laser chip and an optical system arranged between the laser chip and the data carrier, the laser chip comprising a substrate and material layers successively formed on the substrate; wherein the laser chip has an output cleavage face and emits an output laser beam which is inclined to the output cleavage face and enters into the optical system, a portion of the output laser beam which is reflected by the data carrier and reaches the laser chip being reflected by the output cleavage face of the laser chip completely out of the optical system.

According to a further aspect of the present invention, there is provided a method of making a semiconductor laser chip by molecular beam epitaxy, the method comprising the steps of: successively forming material layers on a substrate, the material layers including a provisional top layer; etching a stripe groove in the provisional top layer; and forming at least one additional layer over the provisional top layer by molecular beams which are inclined relative to a plane which is perpendicular to the substrate and contains a longitudinal axis of the stripe. Preferably, the inclination of the molecular beams is in the range of 30–20 degrees.

Other objects, features and advantages of the present invention will be fully understood from the following detailed description given with reference to the accompanying drawings.

DETAILED DESCRIPTION OF THE PREFERRED EMBODIMENTS

Figure 1:
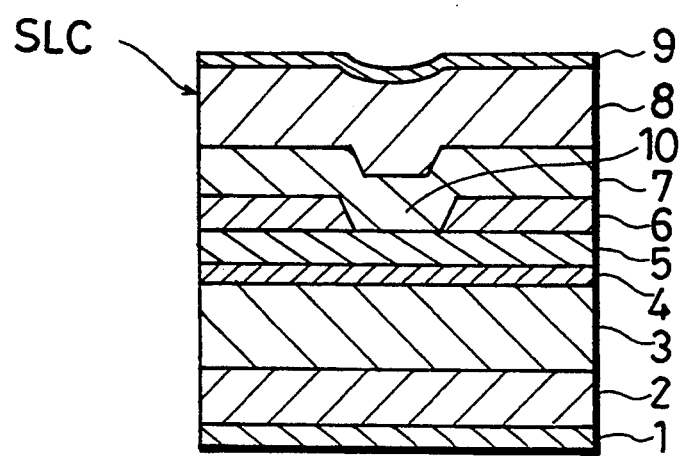
FIG. 1 is a sectional view showing a muti-layer semiconductor laser chip according to the present invention.

Referring to FIG. 1 of the accompanying drawings, there is shown a semiconductor laser chip SLC having a multi-layer structure which includes, from bottom to top, a first electrode 1, a substrate 2, a lower clad layer 3, an activation layer 2, a first upper clad layer 5, a current blocking layer 6, a second upper clad layer 7, a cap layer 8, and a second electrode 9.

The substrate 2 may be made of n-type GaAs. The lower clad layer 3 may be made of n-type $Al_{0.5}GA_{0.5}As$, whereas the activation layer 4 may be made of p-type $Al_{0.15}Ga_{0.85}As$. The first upper clad layer 5 may be made of p-type $Al_{0.5}Ga_{0.5}As$ while the current blocking layer 6 may be made of n-type GaAs. The second upper clad layer 7 may be made of p-type $Al_{0.5}Ga_{0.5}As$, whereas the cap layer 8 may be made of p-type GaAs.

As also shown in FIG. 1, the current blocking layer 6 of the laser chip is interrupted by a stripe 10 (gain region) which itself may be formed by a conventional method. The function of the stripe 10 is to limit current passage to this region. Thus, when a voltage is applied across the respective electrodes 1, 9, stimulation occurs in the activation layer under the stripe 10 to generate a laser beam substantially along a longitudinal axis of the stripe 10.

Figure 2:
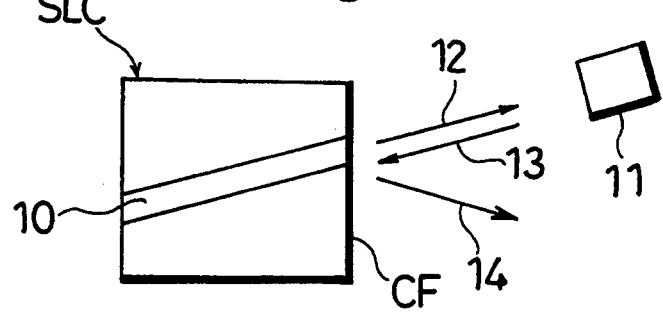
FIG. 2 is a schematic plan view showing a first embodiment of the present invention.

According to a first embodiment of the present invention shown in FIG. 2, the stripe 10 (stripe groove) is made to extend obliquely in a plane parallel to the substrate 1. Thus, the stripe 10 is inclined relative to the output cleavage face CF of the chip.

As shown in FIG. 2, the laser chip SLC forms a laser pickup unit in combination with an opitical system 11 for reading information on a data carrier or optical disk (not shown). Due to the inclined formation of the stripe 10, the laser chip SLC emits an output laser beam 12 which is inclined relative to the output cleavage face CF of the chip, and the laser beam is reflected on the unillustrated optical disk. A part of the reflected laser beam returns to the laser chip, as indicated by an arrow 13. However, the returning portion of the laser beam is reflected by the output cleavage face CF of the laser chip completely out of the optical system 11, as indicated by an arrow 14.

According to the present invention, the output cleavage face CF of the laser chip SLC is capable of reflecting the returning laser beam portion 13 completely out of the optical system 11, so that it is possible to prevent any noises which would result from re-entry of the returning laser beam portion 13 into the optical system 11. Further, the output cleavage face CF need not be covered with a reflection preventive coating or otherwise treated for realization of such noise prevention.

Figure 3:
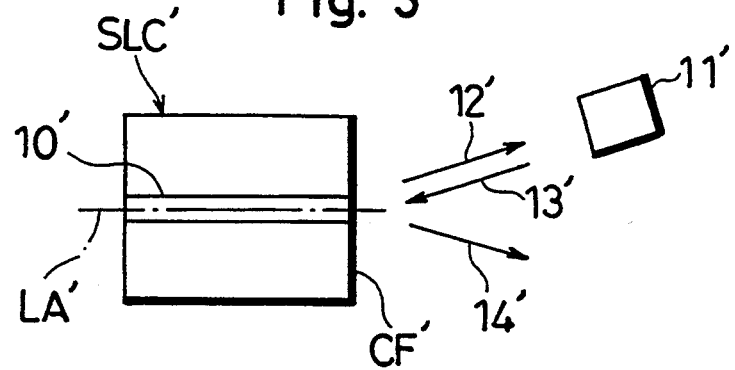
FIG. 3 is a schematic plan view showing a second embodiment of the present invention.

FIG. 3 shows a second embodiment of the present invention. In this embodiment, a semiconductor laser chip SLC' has a non-inclined stripe 10' (stripe groove) but emits an output laser beam 12' which is inclined relative to the output cleavage face CF' of the chip. The output laser beam 12' enters an optical system 11' and is reflected by an unillustrated optical disk for reading the information carried thereby. A part of the reflected returns to the laser chip, as indicated by an arrow 13'. However, the returning portion 13' of the laser beam is reflected by the output cleavage face CF' of the laser chip completely out of the optical system 11', as indicated by an arrow 14'. Thus, the second embodiment of FIG. 3 enjoys the same advantages as the first embodiment of FIG. 2.

According to the second embodiment of FIG. 3, the stripe 10' is not inclined relative to the output cleavage face CF' of the laser chip SLC', but the direction of laser beam emission provided by the laser chip is inclined relative to the output cleavage face CF'. Such inclined laser beam emission is possible because the stripe 10' is made to provide different physical properties on both sides of a central longitudinal axis LA' of the stripe 10' (hereafer referred to as "asymmetric stripe"). It should be appreciated that the asymmetric stripe 10' is visually or macroscopically indistinguishable from the stripe of the prior art laser chip.

The semiconductor laser chip SLC' with the asymmetric stripe 10' may be made in the following manner.

Figure 4:
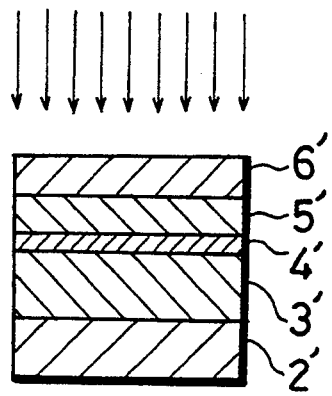
FIGS. 4 through 7 are sectional views illustrating the successive steps of making a laser chip according to the second embodiment of the present invention.

First, as shown in FIG. 4, a lower clad layer 3', an activation layer 4', a first upper clad layer 5', and a current preventive layer 6' are formed on a substrate 2' in the mentioned order by molecular beam epitaxy. In the illustrated embodiment, the substrate 2' is made of n-type GaAs. The lower clad layer 3' is formed of n-type $Al_{0.5}Ga_{0.5}As$ with a thickness of e.g. 15,000 Å, whereas the activation layer 4' is formed of p-type $Al_{0.15}Ga_{0.85}As$ with a thickness of e.g. 600 Å. The first upper clad layer 5' is formed of p-type $Al_{0.5}Ga_{0.5}As$ with a thickness of e.g. 4,000Å while the current blocking layer 6' is formed of n-type GaAs with a thickness of e.g. 4,000 Å.

Figure 5:
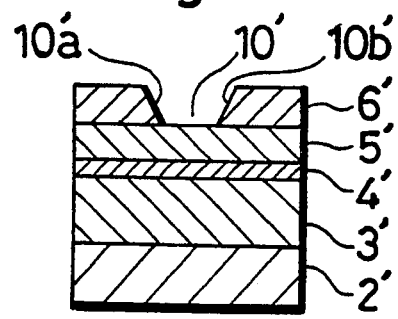

Then, a stripe groove 10' is formed in the current blocking layer 6' by chemical etching or thermal etching, as shown in FIG. 5. The width of the stripe groove 10' may be 4 micrometers, whereas the depth of the strip groove is the same as the thickness of the current blocking layer 6'. The stripe groove 10' is defined by a pair of lateral faces 10a', 10b'.

Figure 6:
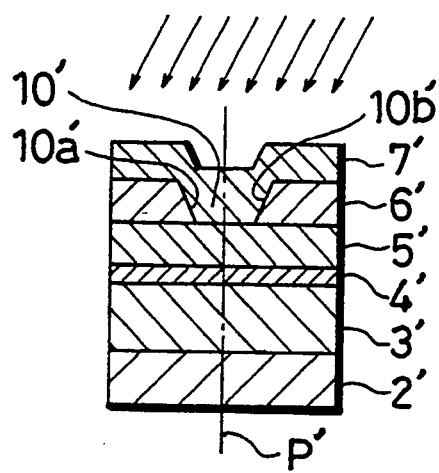

Then, a second upper clad layer 7' of p-type $Al_{0.5}Ga_{0.5}As$ is formed on the current blocking layer 6' by molecular beam epitaxy, as shown in FIG. 6. The thickness of the second upper clad layer 7' may be 10,000 Å for example.

In the process step of FIG. 6, the direction of molecular beams is inclined relative to a plane P' which is vertical to the substrate 2' and contains the central longitudinal line LA' (see FIG. 3) of the stripe groove 10', as indicated by arrows in FIG. 6. In this way, one lateral surface 10b' is more shaded with respect to the molecular beam direction than the other lateral surface 10a'. As a result, crystal growth differs on both sides of the central longitudinal line LA' (FIG. 3) of the stripe groove 10', so that the second upper clad layer 7' will have different physical properties on both sides of the central longitudinal line LA' of the stripe groove 10', as already described. Preferably, the inclination of the molecular beam direction is in the range of 30–40 degrees.

Figure 7:
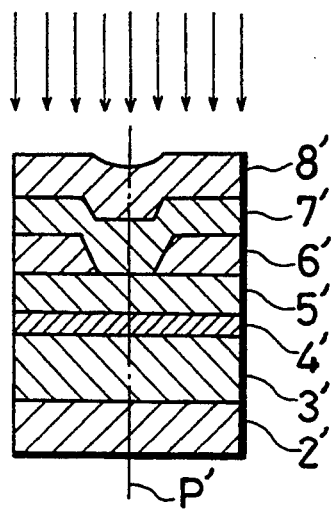

In the next process step, a cap layer 8' of p-type GaAs is formed on the second upper clad layer 7' again by molecular beam epitaxy, as shown in FIG. 7. At this time, however, the molecular beam direction may be parallel to the above-mentioned plane P'. The thickness of the cap layer 8' may be 20,000 Å for example.

Finally, respective electrodes (not shown) are formed on the substrate 2' and the cap layer 8' to obtain a product laser chip (cf. FIG. 1).

Figure 8:
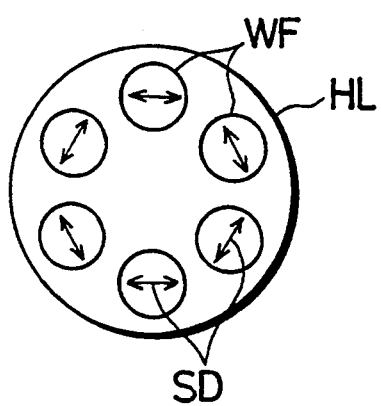
FIG. 8 is a schematic plan view showing an example of arranging wafers in a wafer holder at the time of performing molecular beam epitaxy.
Figure 9:
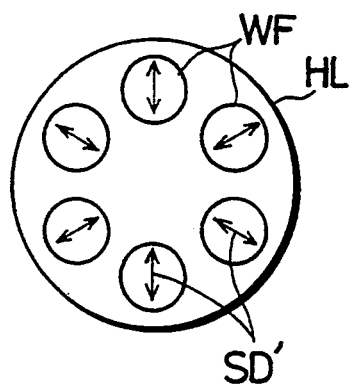
FIG. 9 is a schematic plan view showing another example of arranging wafers in a wafer holder.

In an actual process of molecular beam epitaxy, a pluarlity of wafers (substrates) WF are supported in an annular arrangement by a discal wafer holder HL arranged above a plurality of material vaporizers in a growth chamber, as shown in FIGS. 8 and 9. In arranging the wafers WF on the holder HL, there are two different possibilities with respect to the stripe groove direction. In one instance, the stripe groove direction of each wafer WF is rendered perpendicular to a corresponding radial line of the holder HL, as indicated by each double-headed arrow SD in FIG. 8. In the other instance, the stripe groove of each wafer WF is rendered to coincide with a corresponding radial line of the holder HL, as indicated by each double-headed arrow SD' in FIG. 9.

Figure 10:
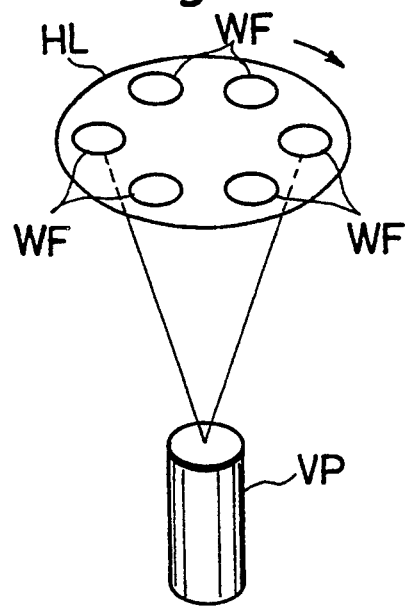
FIG. 10 is a perspective view showing a vaporizer together with a wafer holder in a molecular beam epitaxy apparatus.

FIG. 10 shows a material vaporizer VP arranged immediately under the wafer holder HL for generating molecular beams of arsenic (As). If the stripe orientation shown in FIG. 8 is adopted, the molecular beam direction from the arsenic vaporizer VP is always inclined relative to the above-mentioned plane P' (see FIG. 6) of each wafer WF even if the holder HL is rotated about its center. On the other hand, if the stripe orientation shown in FIG. 9 is adopted, the molecular beam direction is always parallel to the above-mentioned plane P'. Thus, the process step shown in FIG. 6 need be performed with the stripe orientation of FIG. 8, whereas the process step shown in FIG. 4 or 7 may be performed with the stripe orientation of FIG. 9.

It should be appreciated that, in FIG. 9, reference is made only with respect to the arsenic vaporizer VP as a typical example. In reality, however, other material vaporizers (not shown) are arranged around the arsenic vaporizer VP with their respective openings directed to the center of the holder.

Figure 11:
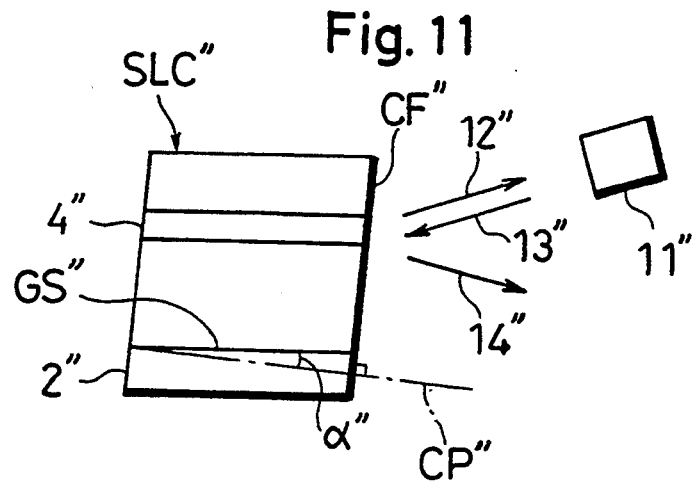
FIG. 11 is a schematic side view showing a third embodiment of the present invention.

FIG. 11 shows a third embodiment of the present invention. In this embodiment, a semiconductor laser chip SLC" has a crystallographically inclined substrate 2" and an activation layer 4" in parallel to the thus inclined substrate 2".

More specifically, the substrate 2" of the semiconductor laser chip SLC" according to the third embodiment has a growth surface GS" which is inclined by an angle α" relative to a reference crystal plane CP". Crystallographically speaking, the reference crystal plane CP" may be represented by Miller indices as (1,0,0), and the growth surface GS" is said to be α" degrees off the (1,0,0) plane in one direction. Due to the crystallographical inclination of the substrate 2", any epitaxial layers subsequently formed on the substrate will be also inclined crystallographically. Thus, the laser chip SLC" will have an output cleavage face CF" which is perpendicular to the reference crystal plane CP" but inclined relative to the growth surface GS" of the substrate 2".

According to the third embodiment, the semiconductor laser chip SLC" emits an output laser beam 12" at an angle (equal to about 3α" in the case of AlGaAs semiconductor laser wherein the reflective index is about 3) relative to the inclined output cleavage face CF". The output laser beam 12" enters an optical system 11" and is reflected by an unillustrated optical disk for reading the information carried thereby. A part of the reflected returns to the laser chip, as indicated by an arrow 13". However, the returning portion 13" of the laser beam is reflected by the output cleavage face CF" of the laser chip completely out of the optical system 11", as indicated by an arrow 14". Thus, the third embodiment of FIG. 11 enjoys the same advantages as the first embodiment of FIG. 2.

Figure 12:
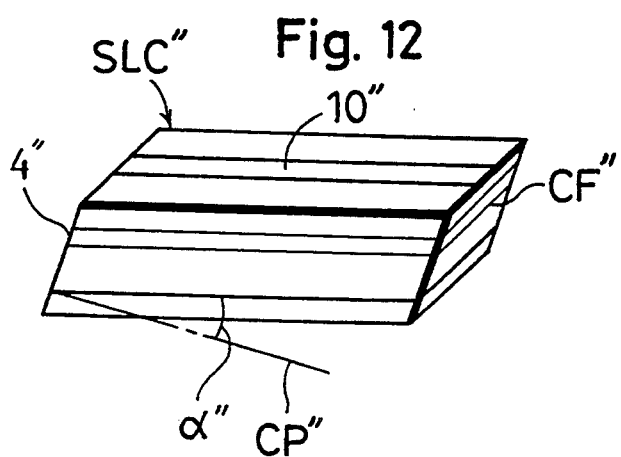
FIGS. 12 and 13 are perspective views illustrating two different crystal orientations.
Figure 13:
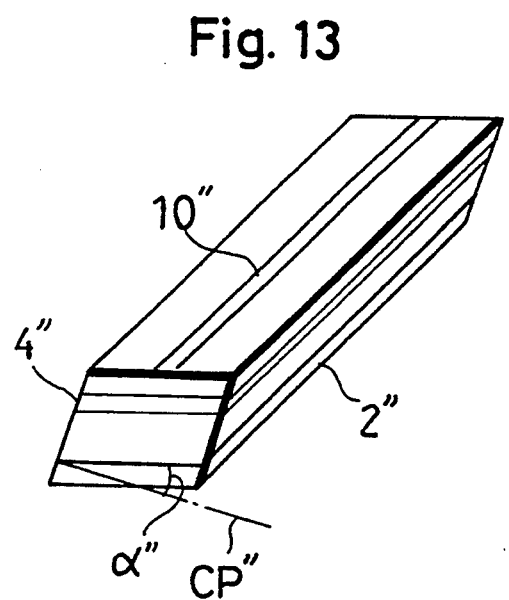
Figure 14:
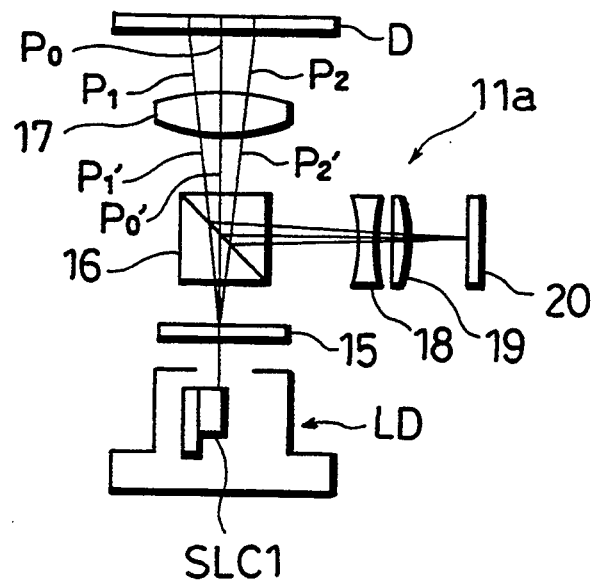
FIG. 14 is a schematic view showing a prior art semiconductor laser pickup unit.
Figure 15:
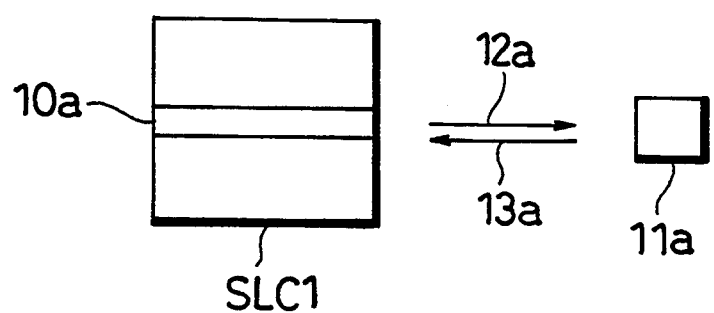
FIG. 15 is a schematic plan view showing a laser chip incorporated in the prior art laser pickup unit.

In the third embodiment, it is important that a stripe 10" extend in the same direction as the growth surface GS" of the substrate 2" is inclined relative to the reference crystal plane CP", as shown in FIG. 12. In this case, the output cleavage face CF" becomes inclined substrate 2". If, as shown in FIG. 13, the stripe 10" is made to extend transversely to the direction in which the growth surface GS" of the substrate 2" is inclined relative to the reference crystal plane CP", the output cleavage face will be perpendicular to the growth surface of the substrate, thus failing to provide intended laser beam emission.

The present invention being thus described, it is obvious that the same may be varied in many other ways. Such variations are not to be regarded as a departure from the spirit and scope of the invention, and all such modifications as would be obvious to those skilled in the art are intended to be included within the scope of the following claims.

I claim:

1. A laser pickup device for optically reading information from an optical data carrier, the pickup device including a semiconductor laser chip and an optical system arranged between the laser chip and the data carrier, the laser chip comprising a substrate and material layers successively formed on the substrate;
   wherein the laser chip has an output cleavage face and emits an output laser beam whose optical axis is inclined to the output cleavage face and enters into the optical system, an optical axis portion of the output laser beam which is reflected by the data carrier and reaches the laser chip being reflected by the output cleavage face of the laser chip completely out of the optical system.

2. The pickup device according to claim 1, wherein the laser chip has a stripe which is inclined relative to the output clevage face.

3. The pickup device according to claim 1, wherein the laser chip has a stripe groove which is perpendicular to the output cleavage face, the chip having different physical properties within the stripe groove on both sides of a central longitudinal axis of the stripe groove, said different physical properties including at least one of refractive index and electrical conductivity.

4. The pickup device according to claim 1, wherein the substrate has a growth surface which is inclined relative to a reference crystal plane in one direction, the laser chip having a stripe extending in the same direction as the growth surface is inclined relative to the reference crystal plane, the output cleavage face being perpendicular to the reference crystal plane but inclined relative to the growth surface of the substrate.

* * * * *